(12) United States Patent
Gu et al.

(10) Patent No.: US 9,935,579 B2
(45) Date of Patent: Apr. 3, 2018

(54) MMWAVE PLL ARCHITECTURE

(71) Applicant: Samsung Electronics Co., Ltd, Suwon-si (KR)

(72) Inventors: Richard Gu, Plano, TX (US); Daquan Huang, Allen, TX (US)

(73) Assignee: Samsung Electronics Co., Ltd., Suwon-Si (KR)

( * ) Notice: Subject to any disclaimer, the term of this patent is extended or adjusted under 35 U.S.C. 154(b) by 81 days.

(21) Appl. No.: 14/995,101

(22) Filed: Jan. 13, 2016

(65) Prior Publication Data

US 2017/0201214 A1    Jul. 13, 2017

(51) Int. Cl.
  *H03L 7/24* (2006.01)
  *H03B 5/12* (2006.01)

(52) U.S. Cl.
  CPC ......... *H03B 5/1234* (2013.01); *H03B 5/1228* (2013.01); *H03L 7/24* (2013.01)

(58) Field of Classification Search
  CPC ........... H03L 7/10; H03L 7/24; H03B 5/1234; H03B 5/1228

USPC .... 331/167, 55, 47, 2, 56, 117 FE; 375/376; 327/156

See application file for complete search history.

(56) References Cited

U.S. PATENT DOCUMENTS

| 6,448,909 | B1 | 9/2002 | Kub et al. | |
| 7,557,664 | B1* | 7/2009 | Wu | H03B 19/14 327/115 |
| 7,683,729 | B2 | 3/2010 | Mansuri et al. | |
| 9,356,608 | B1* | 5/2016 | Hiebert | H03B 5/1256 |

* cited by examiner

*Primary Examiner* — Arnold Kinkead

(57) ABSTRACT

A master voltage controlled oscillator (VCO) produces an output signal at an operating frequency of at least 100 gigaHertz (GHz). A buffer VCO injection-locked to an output of the master VCO produces an output signal at the operating frequency with a voltage swing greater than 50% of an output voltage swing of the master VCO output signal. The buffer VCO operates without pulling, and can drive a load of at least three times greater than a nominal load. Phase noise in the output of the buffer VCO is as much as −96 decibels (dB) relative to the carrier (dBc) per Hertz (Hz) at 125 GHz with a 1 megaHertz (MHz) offset.

20 Claims, 3 Drawing Sheets

MMWAVE PLL ARCHITECTURE

TECHNICAL FIELD

The present disclosure relates generally to oscillators for extremely high frequency transceivers, and more specifically to a voltage controlled oscillator for such extremely high frequency transceivers.

BACKGROUND

Millimeter (mm) wave (mmWave) or extremely high frequency (EHF) radio communications employ frequencies from 30 to 300 gigaHertz (GHz), corresponding to wavelengths between 1 and 10 mm. The design of integrated circuit oscillators operating at such frequencies poses certain design challenges.

SUMMARY

A master voltage controlled oscillator (VCO) produces an output signal at an operating frequency of at least 100 gigaHertz (GHz). A buffer VCO injection-locked to an output of the master VCO produces an output signal at the operating frequency with a voltage swing greater than 50% of an output voltage swing of the master VCO output signal. The buffer VCO operates without pulling, and can drive a load of at least three times greater than a nominal load. Phase noise in the output of the buffer VCO is as much as −96 decibels (dB) relative to the carrier (dBc) per Hertz (Hz) at 125 GHz with a 1 megaHertz (MHz) offset. The master VCO may include an inductive-capacitive tank circuit, and may include an inductor and a capacitor connected in parallel between an upper power supply voltage input and each of two transistors. The buffer VCO may include an inductor connected between an upper power supply voltage input and each of two transistors. Drain terminals for two transistors within the master VCO may be connected to drain regions for two transistors within the buffer VCO, and outputs of the master VCO and the buffer VCO may be taken across drain terminals for two transistors within the respective VCO.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, where such a device, system or part may be implemented in hardware that is programmable by firmware or software. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 1 through 4, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged wireless communication system.

Figure 1:
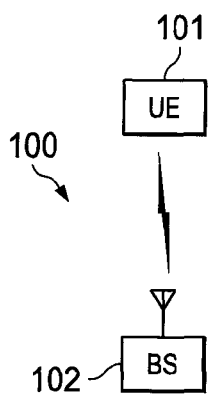
FIG. 1 is a high level diagram illustrating an exemplary wireless communication system within which a mmWave phase-lock loop (PLL) may be implemented in accordance with various embodiments of the present disclosure.

FIG. 1 is a high level diagram illustrating an exemplary wireless communication system within which a mmWave PLL may be implemented in accordance with various embodiments of the present disclosure. The network 100 includes a wireless user device, user equipment 101, coupled by a wireless communications network to a base station (BS) 102. The user equipment 101 may be a "smart" phone or tablet device capable of functions other than wireless voice communications.

Figure 1A:
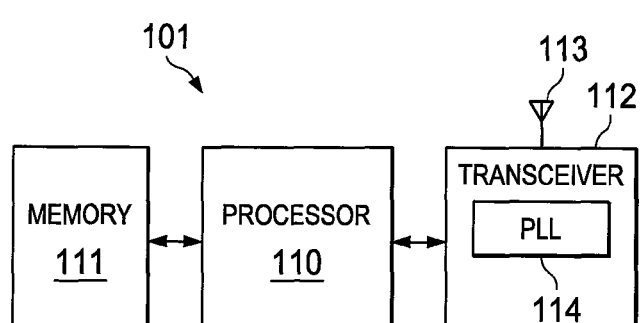
FIG. 1A is a high level block diagram of the functional components of the wireless user device from FIG. 1.

FIG. 1A is a high level block diagram of the functional components of the wireless user device from FIG. 1. User equipment 101 is a mobile phone and includes a processor 110 communicably coupled to a memory 111 that may store or buffer information to be wirelessly communicated, including data and control information. The processor 111 controls wireless communications by the user equipment 101 via transceiver 112 connected to antenna 113 in accordance with known techniques. In the exemplary embodiment, the transceiver includes or is coupled to a PLL 114 formed as described in further detail below.

A major application for a mmWave PLL, which operates at 60 to 120 gigaHertz (GHz) is to generate clock signals at the carrier frequency for the transmitter and/or receiver in wireless data communication. In complementary metal-oxide-semiconductor (CMOS) implementations of a PLL, the transistor cutoff frequency FT is the range of 200 GHz for a 40-60 nanometer (nm) process. Moreover, CMOS processes result in high parasitic passive components such as parasitic resistors and capacitors. Thus, in mmWave PLL design of any circuit with a resonant frequency above 10 GHz, a inductive-capacitive (LC) tank bandpass type circuit is typically used, where the tank frequency is inversely proportional to square root of the inductance and capacitance. Because current CMOS technology creates difficulties in maintaining a voltage-controlled oscillator accurately oscillating at 125 GHz, any extra loading to increase the driving capability on the VCO further drags down the center frequency and reduces signal swing, possibly stopping oscillation. In general, mmWave PLLs have very weak driving capability. Even with driving capability, however, a conventional output buffer will cause the VCO to still burn substantial power and low signal swing as compared to the VCO swing (i.e., voltage swing at the buffer output drops to about 30% of the voltage swing at the VCO output). A need exists for a mmWave PLL architecture that increases the driving capability but still maintains the frequency and swing, and at lower power.

The novel master-slave VCO and VCO type buffer described herein uses a master VCO to determine the desired frequency and a slave VCO buffer to drive the output, where the slave VCO buffer is injection-locked to the master VCO. Due to the self-regenerative character of the VCO-type buffer, the oscillator drives high loads (6× to 8×) while still maintaining high voltage drive, due to the buffer using all of the loading circuit as part of the oscillation tank. The new VCO buffer uses the same digital-controlled artificial dielectric (DiCAD) as master VCO and is frequency tunable, thereby tracking the entire master VCO frequency range, while consuming only 37.5% of the total VCO power. Since phase noise is proportional to voltage swing, the buffer described produces a 2× to 3× swing increase, corresponding to 6-9 decibels (dB) improvement in phase noise. Because a conventional VCO output buffer consumes more power than the VCO when driving a high load (greater than 4×, e.g., 6×), and furthermore drags down VCO frequency by 10%, sustaining VCO oscillation at 125 G is not practical. Due to the master-driving-slave architecture of VCO and VCO buffer described herein, the master VCO determines the frequency with no pulling of VCO frequency.

Conventional VCO buffers usually only drive 1× loading at 125 GHz. When driving 3× loading, the VCO frequency will drop to 110 GHz, and the voltage swing drops to about 30% of VCO. Unlike such conventional designs, which use one VCO driving one passive buffer, the PLL of the present disclosure is based on master-slave structure, where a master VCO (the main VCO) drives a slave VCO-type buffer amplifier with injection locking so as to dramatically boost the loading capability for the buffer while lowering the parasitic loading to the master VCO. The new master-slave VCO and buffer design of the present disclosure has the advantages of maintaining the VCO desired operating frequency, increasing the driving capability by using and absorbing all the loading circuit as part of the oscillation tank, and increasing the voltage swing and improving phase noise. The inductive tuning capability of the master-slave VCO and buffer design described herein increases tuning range and optimizes phase noise, with low power operation. These advantages facilitate mmWave PLL operation, and may be useful for mmWave standardization.

Figure 2:
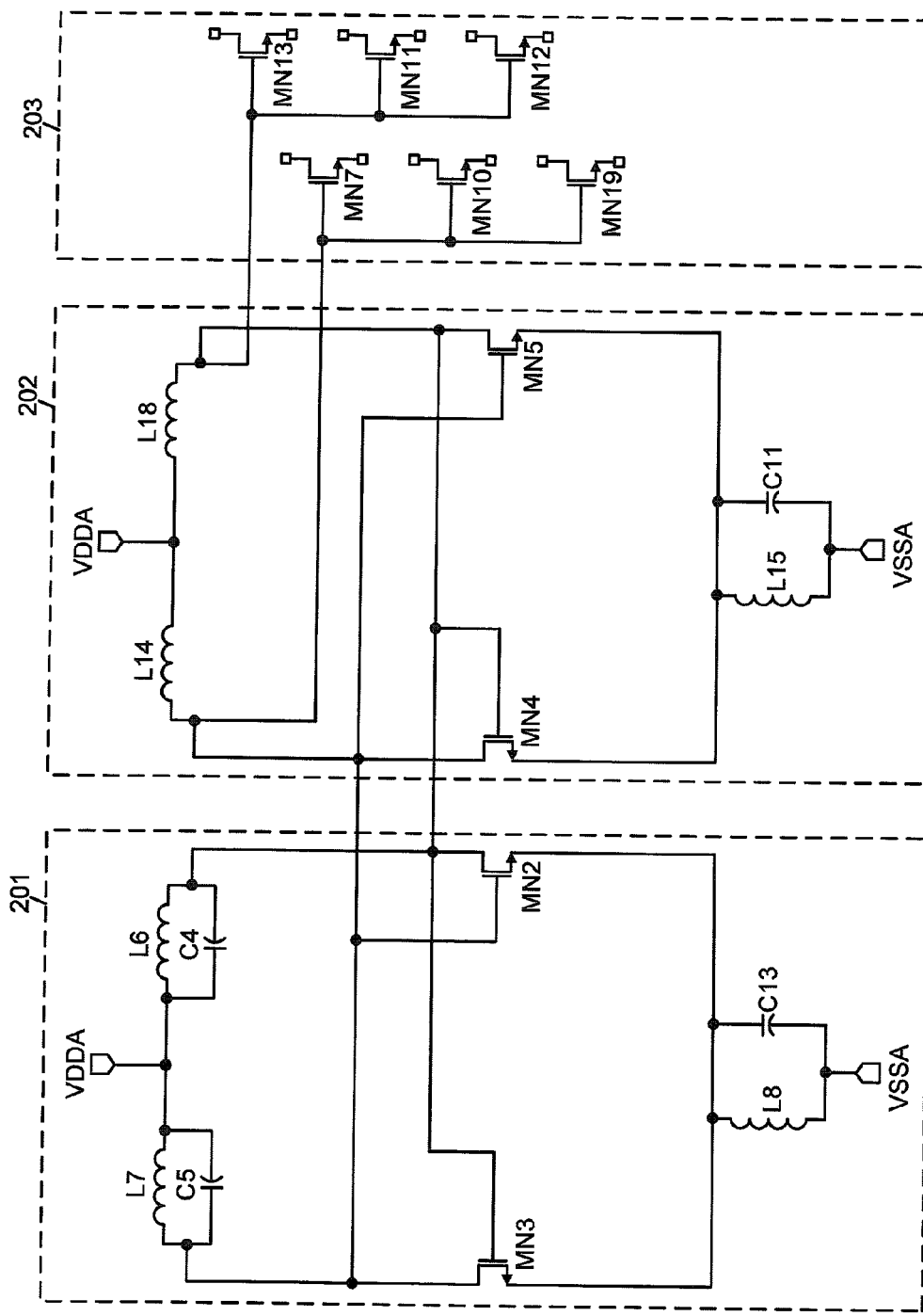
FIG. 2 is a circuit diagram for a portion of a mmWave PLL in accordance with an embodiment of the present disclosure.

FIG. 2 is a circuit diagram for a portion of a mmWave PLL in accordance with an embodiment of the present disclosure. A part of the circuit 200 depicted in FIG. 2 forms a portion of the PLL 114. Specifically, at least the master VCO 201 and the slave or buffer VCO 202 in FIG. 2 form a portion of the PLL 114, while the load 203 may represent other devices within the transceiver 112 not forming part of the PLL 114. As illustrated, the buffer VCO 202 is coupled between an output of the master VCO 201 and the load 203. The load 203 is connected to the output of the buffer VCO 202. The PLL including the circuit described may operate at 100 GHz and beyond while driving high loads at the selected operating frequency.

In the example depicted, the master VCO 201 includes an upper voltage supply input VDDA connected to one terminal of each of two parallel-connected LC circuits. The first of the two LC circuits includes inductor L6 and capacitor C4 connected in parallel and each connected at a first terminal to the upper voltage supply input VDDA. The second of the two LC circuits includes inductor L7 and capacitor C5 connected in parallel and each connected at a first terminal to the upper voltage supply input VDDA. Two cross-coupled n-channel transistors MN2 and MN3 are connected to the second terminals of the two LC circuits. Transistor MN2 is connected at a drain terminal to the second terminals of each of inductor L6 and capacitor C4, and is also connected at the drain terminal to the gate terminal of transistor MN3. Transistor MN3 is connected at a drain terminal to the second terminals of each of inductor L6 and capacitor C4, and is also connected at the drain terminal to the gate terminal of transistor MN2. The drain terminals of transistors MN2 and MN3 provide an output of the master VOC 201. The source terminals of transistors MN2 and MN3 are each connected to a first terminal of each of parallel-connected inductor L8 and capacitor C13. The other terminals of inductor L8 and capacitor C13 are each connected to a lower voltage supply VSSA.

The slave or buffer VCO 202 is connected to the outputs of master VCO 201 at the drain terminals of n-channel transistors MN4 and MN5 within the buffer VCO 202. The drain terminal of transistor MN4 is connected to the drain terminal of transistor MN3 (and to the gate terminal of transistor MN2) within the master VCO 201. The drain terminal of transistor MN5 is connected to the drain terminal of transistor MN2 (and to the gate terminal of transistor MN3) within the master VCO 201. The buffer VCO 202 also includes an upper voltage supply input VDDA, connected to one terminal of each of two inductors L14 and L18. The second terminals of inductors L14 and L18 are connected respectively to the drain terminal of transistor MN4 and to the drain terminal of transistor MN5. The transistors MN4 and MN5 are cross-coupled, with the gate terminal of transistor MN4 connected to the drain terminal of transistor MN5 and the gate terminal of transistor MN5 connected to the drain terminal of transistor MN4. The drain terminals of transistors MN4 and MN5 (connected respectively to the second terminal of each of inductors L14 and L18) provide the output of the buffer VCO 202. The source terminals of transistors MN4 and MN5 are each connected to a first terminal of each of parallel-connected inductor L15 and capacitor C11. The other terminals of inductor L15 and capacitor C11 are each connected to a lower voltage supply VSSA.

The load 203 of circuit 200 is represented by n-channel transistors MN7, MN10 and MN19 connected in parallel at the respective gate terminals to the drain terminal of transistor MN4, and n-channel transistors MN13, MN11 and MN12 connected in parallel at the respective gate terminals to the drain terminal of transistor MN5.

Figure 3:
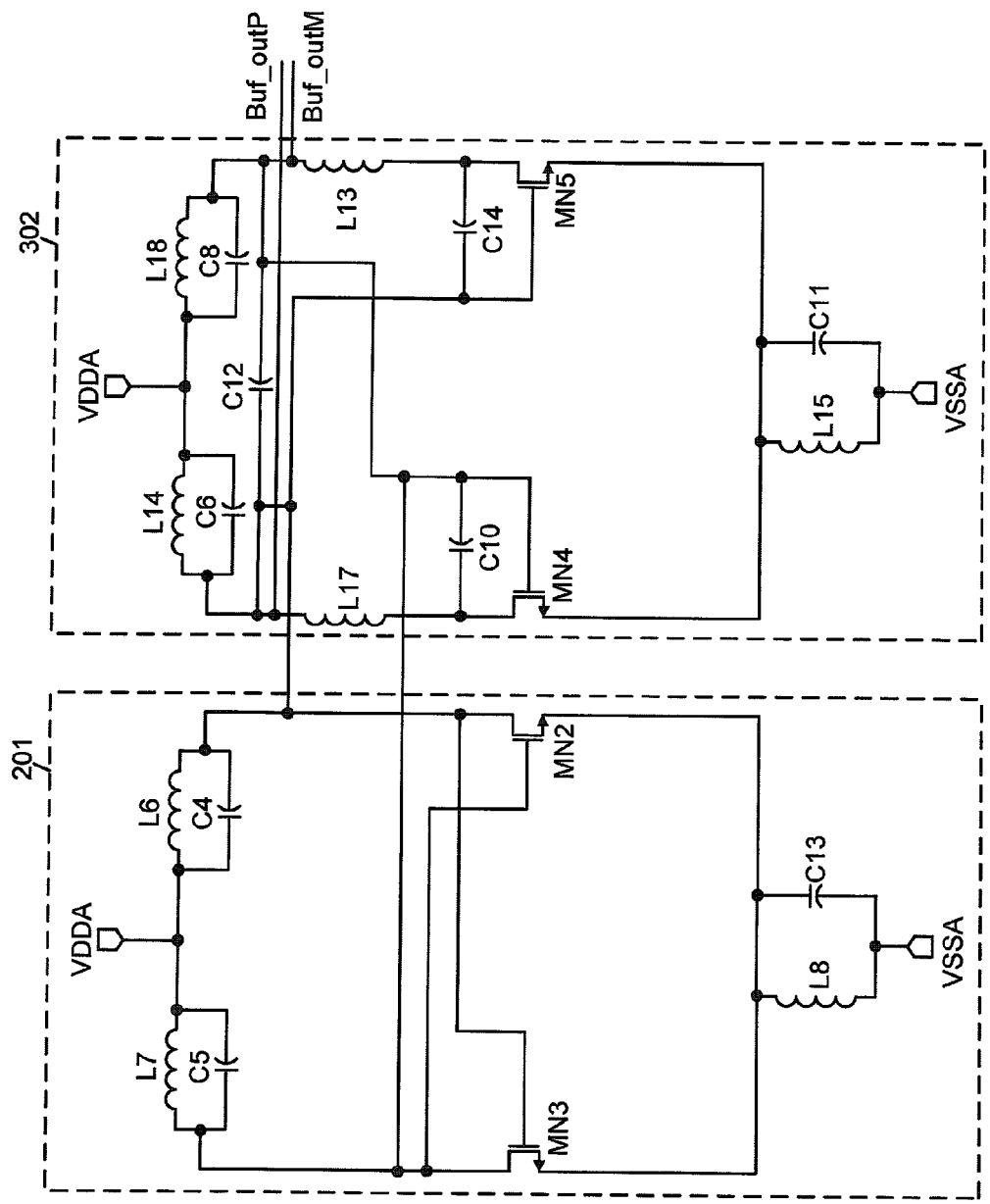
FIG. 3 is also a circuit diagram for a portion of a mmWave PLL in accordance with an embodiment of the present disclosure.

FIG. 3 is also a circuit diagram for a portion of a mmWave PLL in accordance with an embodiment of the present disclosure. The master VCO 201 of circuit 300 is unchanged. For the buffer VCO 302 of circuit 300, however, parasitic capacitances and inductances have been explicitly shown: capacitance C10 between the gate and drain terminals of transistor MN4; capacitance C14 between the gate and drain terminals of transistor MN5; capacitance C6 across the terminals of inductor L14; capacitance C8 across the terminals of inductor L18; inductance L17 between the drain terminal of transistor MN4 and the inductor L14; inductance L13 between the drain terminal of transistor MN5 and the inductor L18; and capacitance C12 across the inputs and outputs of the buffer VCO 302, at the terminals of inductances L17 and L13 opposite the connection to the drain terminals of transistors MN4 and MN5. With the parasitic capacitances and inductances taken into consideration, the outputs of the master VCO 201 are received at the gate terminals of transistors MN4 and MN5, which are electrically separated from the respective drain terminals of transistors MN4 and MN5 by capacitances C10 and C14. The outputs Buf_outP and Buf_outM of the buffer VCO 302 are taken at the terminals of inductances L17 and L13 opposite the connection to the drain terminals of transistors MN4 and MN5.

Unlike conventional PLL designs that use one VCO driving one passive buffer, the PLL of the present disclosure is based on a master-slave structure, where a master VCO (the main VCO) drives a slave VCO-type buffer amplifier with injection locking (i.e., no pulling) so as to drastically boost the loading capability for the buffer while lowering the parasitic loading to the master VCO. Simulations indicate that the design described can achieve an output voltage swing for the buffer VCO of 1.4 volts (V) at 125 GHz when the output voltage swing of the master VCO is 1.6 V at 125 GHz, with loading on one 125 GHz divider and one buffer. At 87.5%, this output voltage swing is greater than 50% and significantly greater than the 30% discussed above in connection with alternate designs. The buffer VCO buffer is frequency tunable, to track the entire range of the master VCO, while consuming only 37.5% of total power for both the master and buffer VCOs.

Figure 4:
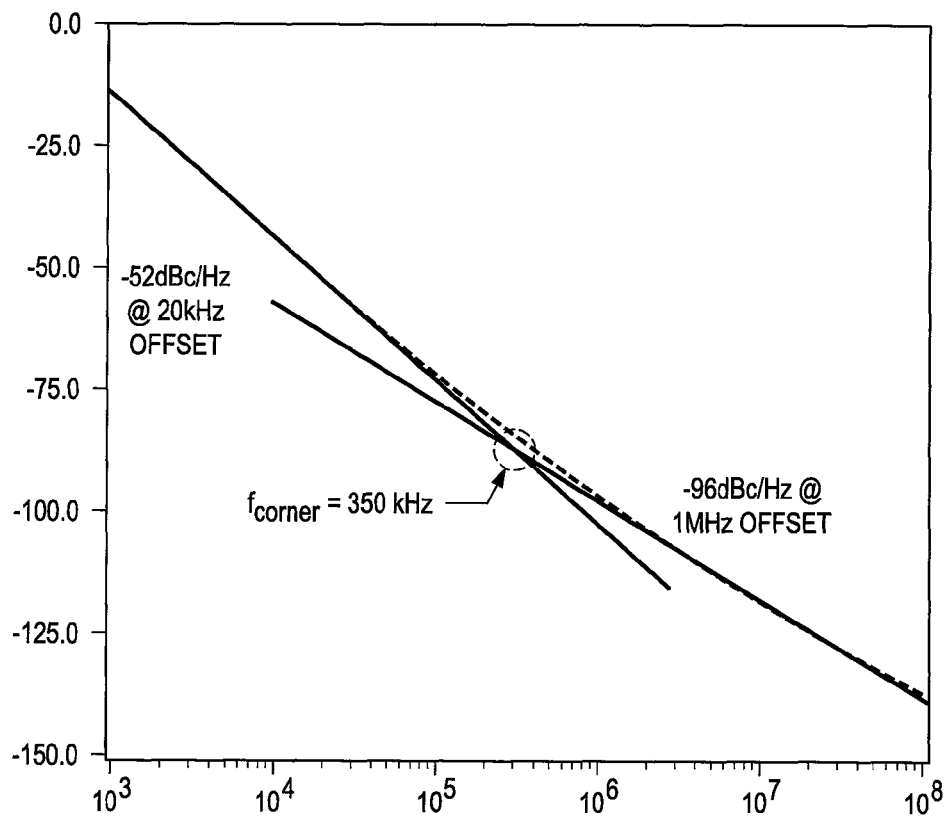
FIG. 4 is a plot illustrating phase noise for at output of a master VCO and buffer VCO within a mmWave PLL in accordance with an embodiment of the present disclosure.

FIG. 4 is a plot illustrating phase noise for at output of a master VCO and buffer VCO within a mmWave PLL in accordance with an embodiment of the present disclosure. Using accurate, post-layout simulation, the phase noise of output from a master VCO with a buffer VCO connected is −96 decibels (dB) relative to the carrier (dBc) per Hertz (Hz) at 125 GHz with a 1 megaHertz (MHz) offset. The corner frequency $f_{corner}$ is 350 kiloHertz (KHZ).

The master-slave VCO and buffer of the present disclosure provides advantages including: the ability to maintain operation of the VCO at a desired operating frequency; increased driving capability by using and absorbing all loading circuit as part of the oscillation tank; prevention of the circuit stopping oscillation when the load is heavy; increased voltage swing and improved phase noise; inductive tunable capability increasing tuning range and optimal phase noise; and low power operation.

In optimizing the master-slave VCO and buffer of the present disclosure, the design of the master VCO may be based on selection of an operating frequency $W_{osc}$ by $$W_{osc} = \frac{1}{\sqrt{L_m C_m}}$$

where $L_m$ is the master VCO total inductance and $C_m$ is the master VCO total capacitance. Since the slave of buffer VCO should also oscillate at $W_{osc}$, using the calculated total loading capacitance $C_{load}$ for the buffer VCO, the tank inductance $L_{slave}$ may be determined by $$L_{slave} = \frac{1}{C_{load} W_{osc}^2}.$$

In order to avoid pulling, the power of the slave or buffer VCO should be 2 to 4 times smaller than the power of the master VCO.

The master-slave VCO and buffer structure of the present disclosure has the advantages of low power, smaller silicon area and lower phase noise as compared with prior PLL architectures. For a system with four transmitters and four receivers, simulation and layout results show that: silicon area is 0.02 mm² as compared to 0.16 mm²; power is 25 milliWatts (mW) as compared to 200 mW; and phase noise is −96 dB at 1 MHz as compared to −90 dB at 1 MHz. mmWave communications at frequencies of 60 GHz and 120 GHz need wide data bandwidth, multiple transmitters/receivers, and low power operation, together with wide tuning range, low power, and high driving capability in the PLL itself. When the load and frequency are both high, the advantages of the architecture described are valuable for millimeter wave PLL design.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A system, comprising:
   a master voltage controlled oscillator (VCO) configured to produce an output signal at an operating frequency of at least 100 gigaHertz (GHz); and
   a buffer VCO injection-locked to an output of the master VCO and configured to produce an output signal at the operating frequency with a voltage swing greater than 50% of an output voltage swing of the master VCO output signal, wherein the buffer VCO is configured to drive a load of at least three times greater than a nominal load.

2. The system according to claim 1, wherein the buffer VCO is configured to operate without pulling.

3. The system according to claim 1, wherein the operating frequency is up to 300 GHz.

4. The system according to claim 1, wherein the buffer VCO produces phase noise of −96 decibels (dB) relative to carrier (dBc) per Hertz (Hz) at 125 GHz with a 1 megaHertz (MHz) offset.

5. The system according to claim 1, wherein the master VCO includes an inductive-capacitive tank circuit.

6. The system according to claim 1, wherein the master VCO includes an inductor and a capacitor connected in parallel between an upper power supply voltage input and each of two transistors.

7. The system according to claim 1, wherein the buffer VCO includes an inductor connected between an upper power supply voltage input and each of two transistors.

8. The system according to claim 1, wherein drain terminals for two transistors within the master VCO are connected to drain regions for two transistors within the buffer VCO.

9. The system according to claim 1, wherein an output of the master VCO is taken across drain terminals for two transistors within the master VCO.

10. The system according to claim 1, wherein an output of the buffer VCO is taken across drain terminals for two transistors within the buffer VCO.

11. A method, comprising:
    using a master voltage controlled oscillator (VCO), producing an output signal at an operating frequency of at least 100 gigaHertz (GHz);

injection-locking a buffer VCO to an output of the master VCO to produce an output signal at the operating frequency with a voltage swing greater than 50% of an output voltage swing of the master VCO output signal; and using the buffer VCO to drive a load of at least three times greater than a nominal load.

12. The method according to claim 11, further comprising:

operating the buffer VCO without pulling.

13. The method according to claim 11, wherein the operating frequency is up to 300 GHz.

14. The method according to claim 11, wherein the buffer VCO produces phase noise of −96 decibels (dB) relative to carrier (dBc) per Hertz (Hz) at 125 GHz with a 1 megaHertz (MHz) offset.

15. The method according to claim 11, wherein the master VCO includes an inductive-capacitive tank circuit.

16. The method according to claim 11, wherein the master VCO includes an inductor and a capacitor connected in parallel between an upper power supply voltage input and each of two transistors.

17. The method according to claim 11, wherein the buffer VCO includes an inductor connected between an upper power supply voltage input and each of two transistors.

18. The method according to claim 11, wherein drain terminals for two transistors within the master VCO are connected to drain regions for two transistors within the buffer VCO.

19. The method according to claim 11, wherein an output of the master VCO is taken across drain terminals for two transistors within the master VCO.

20. The method according to claim 11, wherein an output of the buffer VCO is taken across drain terminals for two transistors within the buffer VCO.

* * * * *